United States Patent

Kohnle et al.

[11] Patent Number: 6,120,672
[45] Date of Patent: Sep. 19, 2000

[54] PROCESS FOR MANUFACTURING INDUCTIVE COUNTING SYSTEMS

[75] Inventors: Franz Kohnle; Heinrich Meyer; Gonzalo Urrutia Desmaison, all of Berlin, Germany

[73] Assignee: Atotech Duetschland GmbH, Berlin, Germany

[21] Appl. No.: 09/068,404

[22] PCT Filed: Feb. 21, 1997

[86] PCT No.: PCT/EP97/00845

§ 371 Date: Jun. 5, 1998

§ 102(e) Date: Jun. 5, 1998

[87] PCT Pub. No.: WO97/39163

PCT Pub. Date: Oct. 23, 1997

[30] Foreign Application Priority Data

Apr. 17, 1996 [EP] European Pat. Off. .............. 96106010

[51] Int. Cl.[7] ................................................. C23C 28/00
[52] U.S. Cl. .............................................................. 205/188
[58] Field of Search ............................................ 205/188

[56] References Cited

U.S. PATENT DOCUMENTS 4,666,735  5/1987  Hoover et al. ......................... 427/43.1

FOREIGN PATENT DOCUMENTS 0 483 484  5/1992  European Pat. Off. .

OTHER PUBLICATIONS

RCA Technical Notes, No. 768, Apr. 1, 1968, pp. 1–5, XP002031760, R.J. Ryan, "Printed Circuit Techniques", see pp. 1–5.

*Primary Examiner*—Kathryn Gorgos
*Assistant Examiner*—Edna Wong
*Attorney, Agent, or Firm*—Burns, Doane, Swecker & Mathis, L.L.P.

[57] ABSTRACT

A process is described for producing inductively operating counting systems by forming a conducting structure on an electrically non-conducting substrate, comprising a step involving the application of a suitable catalyst for the currentless deposition of metals onto the electrically non-conducting substrate as well as conventional pretreatment and post-treatment steps. The following process steps are essential for the process according to the invention:

1) Application of a liquid photoresist, the liquid photoresist being printed only onto the surface not subsequently covered by the conductive pattern and onto the fine-structured portions of the conduction pattern,
2) Subsequent photostructuring of the fine-structured portions of the conductive pattern by illumination and subsequent developing,
3) Subsequent currentless deposition of a first thin metallic layer onto the exposed, catalytically coated surface regions,
4) Subsequent electrolytic deposition of a second metallic layer onto the first metallic layer, and
5) Subsequent application of a decorative protective lacquer or varnish film.

5 Claims, 1 Drawing Sheet

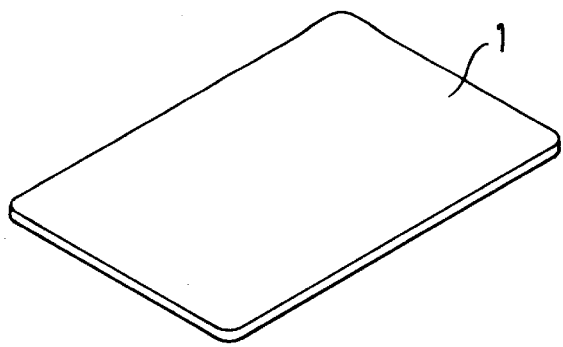
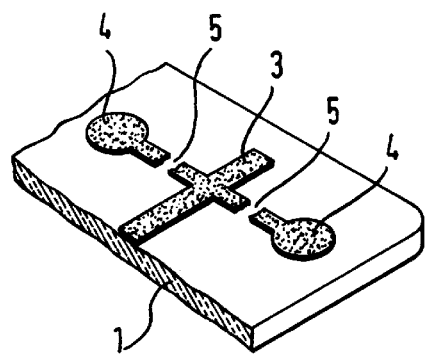
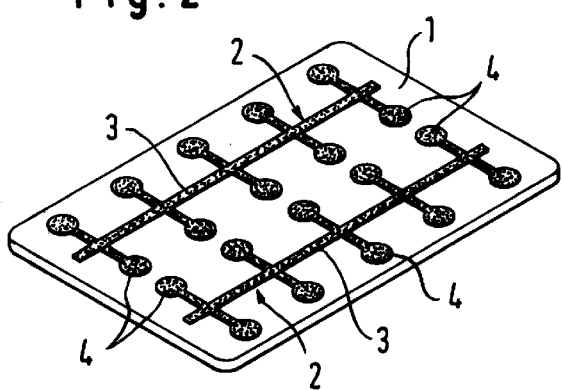
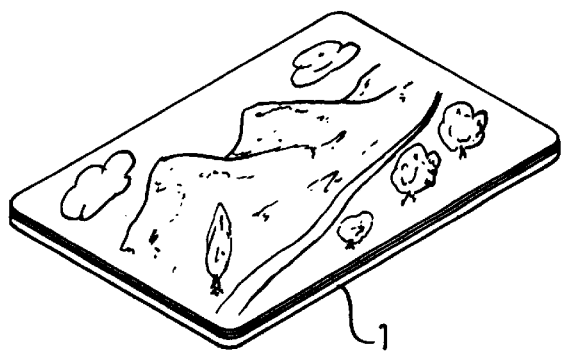
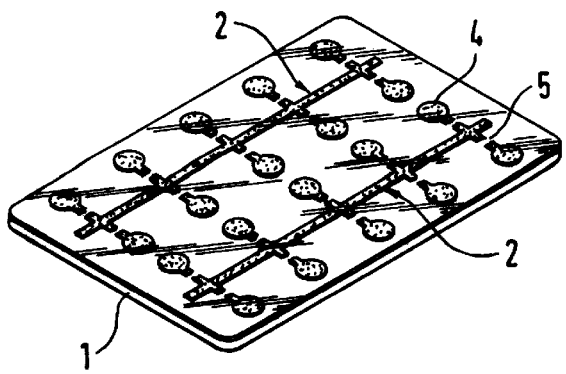

PROCESS FOR MANUFACTURING INDUCTIVE COUNTING SYSTEMS

This is a national stage application of PCT/EP97/00845 filed Feb. 21, 1997.

BACKGROUND OF THE INVENTION

The invention relates to a process for producing inductively operating counting systems, for example inductively operating phone cards.

The normal phone cards that are currently used may be divided into two different categories. Those used in Europe and the USA employ magnetic layers for information storage. The phones in which the card is to be used accordingly include a device for reading and writing information on the card. Thus, stored information, for example the number of charge units still left, is read and overwritten with new information at specific time intervals.

In a further type of phone cards, as are used for example in Brazil, another, substantially simpler principle of information storage is used. These phone cards consist of a dielectric medium on which a thin structured metallic layer has been applied. The essential feature of this metallic layer is its geometrical shave, which is characterised by a large number of fine, conductor-like webs or ridges. The card functions in the following way: the telephone in which the card is used induces successive induction currents in the card which cause these fine webs or ridges to melt one after another, thereby using up the units on the card. These very fine ridges thus function like a fuse. When all these ridges have melted, the card is used up. Such phone cards and the associated phones are simple in design and construction, inexpensive and robust, since no magnetic writing or reading head is required. Phone cards of this type are hereinafter termed inductively operating phone cards. Naturally, this principle can also be used as a counting system for other units.

According to Brazilian Patent Application 9105585 A, these cards are produced by a process in which a first, conducting layer having a relatively high resistance is first of all applied by chemical means on an impermeable, non-porous substrate. A substantially thicker layer of a metal or metal alloy having a considerably lower resistance than that of the first layer is then applied by electrolytic deposition. The second layer consists for example of a tin-lead alloy, while the first layer consists of a currentless deposited nickel layer.

Plastic substrates, preferably of acrylonitrile-butadiene-styrene (ABS) polymers, polyvinyl chlorides or epoxy resins are employed as starting materials in the production process that is currently used. For example, two films or sheets of the aforementioned materials having the appropriate dimensions, e.g. 400×600 mm, are first of all welded together. A so-called "multicopy" is thereby obtained. A preliminary treatment is then performed by etching, brushing or similar processes to roughen and/or hydrophilise the nonconducting surface, so as to ensure a sufficient degree of adhesion of the metallic layer to be applied without using an external current.

This process step is then followed by a catalytic activation, for example by coating the plastic surface with palladium nuclei. A chemically reductive metallisation of the whole surface is then carried out, in practice generally a currentless nickel-plating. These process steps are known per se from the metallisation of plastics.

The next step is the formation of a conductive pattern on the metallic layer, especially the fine metal ridges. For this purpose, in a similar way to the production of printed circuit boards, a photo-structurable layer is applied, for example by laminating a photoresist film. So-called negatively operating dry films are used for this purpose, which are also conventionally known in printed circuit board technology. The illumination and development of the conductive pattern are carried out by conventional methods, i.e. after developing, the resist is removed from those places where the conductive pattern is subsequently to be formed. Finally, the metallic layer applied by metallisation without the use of external current is galvanically reinforced at the bare or exposed sites, i.e. in the resist channel, and in fact preferably with a tin-lead alloy. In order to produce the actual conductive pattern the photoresist film is first of all removed, as a rule by treatment with aqueous alkaline solutions (resist strippers). The currentless deposited metallic layer that is now exposed then has to be removed by etching. The subsequent coating with a suitable varnish or lacquer protects the card, and the protective lacquer may also receive a decorative pattern.

The sheets welded together at their edges are then normally separated from one another and the individual cards are formed by punching or cutting.

If desired the card can be divided into two parts. The disadvantages of the existing process, which is mainly aimed at the so-called subtractive process normally used for printed circuit boards, are firstly the difficulty in reproducibly etching the melt ridges, which are only about 100 $\mu$m wide, with a sufficiently high degree of precision. The high demand on precision is a result of the function of the ridges, which of course must have a defined electrical resistance, which in turn determines the melt behaviour ($W=I_2\times R$). It is found in practice that the reject rate is considerable on account of the problems involved in etching the ridges.

The reasons for this are on the one hand the resolution of the dry film resist, and on the other hand the technical limits in etching the conduction part.

SUMMARY OF THE INVENTION

The object of the invention is to overcome the aforedescribed deficiency of the known process and to provide a substantially more economic process for producing counting systems of the aforedescribed second types.

This object is achieved according to the invention by a process for producing inductively operating counting systems by forming a conductive structure on an electrically non-conducting substrate, said process comprising a step involving the application of a suitable catalyst for the currentless deposition of metals onto the electrically non-conducting substrate as well as conventional pretreatment and post-treatment steps, which is characterised by the following process steps:

1) Application of a liquid photoresist, the said liquid photoresist being printed only onto the surface not subsequently covered by the conductive pattern and onto the fine-structured portions of the conduction pattern,
2) Subsequent photostructuring of the fine-structured portions of the conductive pattern (in particular the ridges) by illumination and subsequent developing,
3) Subsequent currentless deposition of a first thin metallic layer onto the exposed, catalytically coated surface regions,
4) Subsequent electrolytic deposition of a second metallic layer onto the first metallic layer, and
5) Subsequent application of a decorative protective lacquer or varnish film, the step of application of the suitable catalyst for the currentless deposition of metals being carried out either before the process step 1) or before the process step 3).

A preferred embodiment of the process according to the invention is characterised in that the process step 4) is followed by a photoresist removal step.

A further preferred embodiment of the process according to the invention is characterised in that the step of the application of the suitable catalyst for the currentless deposition of metals is carried out before the process step 3), and that the photoresist together with the catalyst adsorbed thereon is then removed.

In the case where inductively operating phone cards of the aforedescribed type are produced, according to the invention the special features of the conductive pattern of the phone card are utilised efficiently and advantageously compared to the known production process:

1. In contrast to printed circuit boards or semiconductor devices, in which the conducting paths normally occupy only 5 to 25% of the surface, with the second type of phone cards by far the greater part of the surface consists of metal.
2. A further specific feature of the phone card is that—in contrast to printed circuit boards there are no metallic island structures. This means that all elements of the whole conductive pattern are connected in an electrically conducting manner.

On the basis of these two features, the production process according to the invention provides the following advantages:

Firstly, the complete elimination of etching of the conductive pattern, and secondly a huge saving in material and costs in the photostructuring process. In contrast to the known process, which is based on printed circuit board production, in the process according to the invention the photostructuring (i.e. the coating of the phone card with the photoresist, illumination and development) takes place after activation of the whole surface. The subsequent currentless metallisation process then already produces the conductive pattern since of course no metal is deposited on the places covered with resist. Since there are no island structures, the conductive pattern produced by metallisation without the use of external current can then be galvanically reinforced by an electrolytic metallisation process without any problem.

After removal of the photoresist the conductive pattern produced in this way according to the invention is then ready for use, without having to be etched. The avoidance of the etching step not only represents a cost saving and the avoidance of effluent, but considerably enhances the process security since the geometrical definition of the ridges is significantly improved.

A further considerable cost saving combined with an even better geometrical definition of the metal ridges is obtained if, instead of a negatively operating dry film, which of course is laminated onto the whole surface, a liquid photoresist is applied by a silk screen printing process only to the surface that is not subsequently covered by the conductive pattern and to the fine-structured portions of the conductive pattern, only a small proportion of the surface of the card, depending on the conductive pattern and amounting to only 5 to 10% of the card surface in present day phone cards, being printed with the liquid photoresist. The actual photoprocess then serves only to produce the fine, approximately 100 $\mu$m-wide ridges.

The advantages are obvious:

Consumption of photoresist and developing and stripping baths are reduced more than tenfold, since the liquid resist need no longer be applied over the whole surface but only to the metal-free surfaces in a substantially thinner layer than in the case of a dry film, with the result that there is a more than 50%. saving in material on account of the reduced layer thickness.

Finally, there is a saving in materials compared to the conventional dry film process by a factor of 10 to 20, which may even be higher in special cases. Furthermore, in most cases film stripping can even be omitted since the thin photoresist is normally not affected by the subsequent printing of the card with the final layer.

According to a preferred embodiment of the invention a positively operating, liquid photoresist is used. This combines the advantage of a reduced sensitivity to dust and dirt. Moreover, in this case as a rule a considerably improved resolution is obtained.

By the process according to the invention means can be produced for irreversible information storage, especially automatic machine cards for electronic debiting and preferably phone cards of the aforedescribed type. In order to store and read the stored information on the automatic machine cards, for example phone cards, the metallic structures on the card are inductively activated and accessed. In the storage/reading process a set of primary coils together with a coil is arranged over each field of the metallic structure. In order to store information a magnetic field produced by an alternating voltage is then induced in individual primary coils and this in turn induces an alternating voltage in the individual fields. If individual fields are short-circuited by bridges, the current in the primary coils rises and produces a magnetic field. If there are no bridges, then the current in the primary coils is low.

To change the stored information the relevant bridge must be destroyed, so that the fields are separated from one another. This is achieved simply by briefly increasing the alternating voltage in the primary coil. The invention will now be described and illustrated in more detail in the case of the production of phone cards of the aforementioned type and with reference to the accompanying drawings.

BRIEF DESCRIPTION OF THE DRAWINGS

FIG. 1 is a substrate for a phone card, as is used in the process according to the invention.

FIG. 2 shows the substrate printed by silk screen printing with the liquid photoresist, by the process according to the invention.

FIG. 3 is a view of FIG. 2.

FIG. 4 shows the product of the penultimate state of the process according to the invention.

FIG. 5 shows the finished, decoratively coated phone card as is obtained by the process according to the invention.

DETAILED DESCRIPTION OF THE INVENTION

The individual steps of the process according to the invention are described in more detail hereinafter. In principle the steps described hereinafter are performed using the materials and procedures known from printed circuit board technology, and are described in the relevant literature, for example in "Handbuch der Leiterplattentechnik", (Handbook of Printed Circuit Board Technology), 2nd Edition, 1982, Eugen G. Leuze Verlag, Saulgau.

Pretreatment

As in the conventional processes, the starting material in the process according to the invention is an electrically non-conducting plastic substrate, in particular one fabricated from an acrylonitrile-butadiene-styrene copolymer (ABS), polyvinyl chloride, or epoxy resins. FIG. 1 shows such a substrate, 0.4 mm thick, obtained by welding two ABS sheets having dimensions of 400×600 mm. The surface of the substrate can be retreated by suitable means in order to ensure a sufficient adhesion between the metallic structures and the surface. This pretreatment generally involves cleaning and mechanical or chemical roughening of the surfaces. The surfaces are as a rule hydrophilised, i.e. rendered water-wettable. In addition chemical functional groups in the surface can also be modified by specific chemical reactions. Detergent-containing aqueous solutions are in general used as cleaning solutions. The cleaning action can be assisted by mechanical movement of the treatment solution. The additional use of ultrasound is particularly effective. Various processes that are adapted to the respective materials of the non-conductors can be used to chemically roughen the surfaces. For ABS polymers and epoxy resins chromic acid-containing solutions, for example chromosulphuric acid, have proved particularly suitable. It is also possible to use alkaline permanganate solutions, the latter in combination with organic swelling solutions, concentrated sulphuric acid and, in the case of polyamides, alkaline solutions of organic solvents.

1st step

In this step of the process according to the invention the coarse structure of the negative conductive pattern is printed on with a liquid photoresist by a silk screen process. It is an essential feature of the process according to the invention that in this step the liquid photoresist is printed by silk screen printing only onto the surface that is not subsequently covered by the conductive pattern and onto the fine-structured portions of the conductive pattern. According to the invention, only 1 to 10% of the substrate surface for example is printed with the liquid photoresist.

According to a preferred embodiment of the invention a positively operating, silk screen printable photoresist is used.

Instead of a liquid photoresist, a suitable solder photosensitive resist material may also be used.

The substrate pretreated as described above and printed with the liquid photoresist is illustrated in FIG. 2. The substrate is indicated by the reference numeral (1), while the liquid photoresist, printed on in the shape of a tree, is indicated by the reference numeral (2). As can be seen from FIG. 2, the tree-shaped imprint (2) comprises trunklike regions (3) and foliate regions (4).

Other conductive patterns and/or circuit designs can of course be produced, with the process according to the invention.

The liquid photoresist has been adjusted in a manner known per se as regards its Theological and thixotropic properties so as to be silk screen printable. For example, the viscosity can be adjusted by adding suitable thixotropy-imparting agents such as organo-bentonites, kaolins, alginic acids, finely divided salicylic acid or similar substances, which are also contained in most solder resist materials. The viscosity and thixotropic behaviour correspond to those of silk screen printing inks commonly used in printed circuit board technology.

2nd step

In this step the imprinted liquid positive photoresist is illuminated through an image pattern, preferably a slit mask, so that for example a web or ridge about 100 µm wide is formed. A slit mask is used that is designed so that only the region of the "bough" corresponding to the ridge is illuminated. The photoresist is made water-soluble by illuminating only the ridge site, and is then developed with an alkaline agent, for example a dilute aqueous solution of sodium carbonate. The "ridge" formed in this way is identified in FIG. 3 by the reference numeral (5).

When using a negative liquid photoresist, a negative mask must correspondingly be used.

3rd step

In this step a thin first metallic layer is deposited in a currentless manner on the regions in which the catalytically active layer has been exposed. The thickness is governed by the requirements of the phone card and at the present time is at most 10 µm. No metal is deposited in the remaining regions. Examples of suitable metals that can be deposited in a currentless manner are nickel, copper, gold, palladium and cobalt. Non-alkaline baths are preferred since in this case photoresist materials can be used that can be developed and removed in alkaline solutions.

Generally, for this purpose baths are used from which the metal can be deposited by reduction by means of reducing agents contained in the bath. For example, copper can be deposited from formaldehyde-containing alkaline baths, but also from hypophosphite-containing acidic or neutral baths. Copper baths containing boron hydride compounds, for example, baths containing sodium borohydride and dimethylaminoborane, are also known. Nickel and cobalt as well as their alloys are preferably deposited from hypophosphite-containing solutions. In this case phosphorus alloys are formed. Boron alloys of the metals are obtained with boron hydride compounds. Noble metals are preferably deposited from boron hydride-containing baths. Formic acid-containing and formate-containing solutions are also known for depositing palladium.

Another possibility of depositing metals in a currentless way is to adsorb the reducing agent on the surface to be coated and reacting the reducing agent with the metal ions in the currentless bath. As an example, the tin(II) ions contained in a palladium-tin catalyst, which are present on the surface as tin(II) hydroxides, may be used for this purpose. This procedure is described in EP 616 053 Al.

4th step

After producing the first, thin, conductive metallic layer, the latter is reinforced by further electrolytic metallisation. The necessary layer thickness of 10 to 50 µm is achieved by electrolytic metal deposition. This is performed using conventional galvanic baths. Also, the deposition conditions correspond to those used in printed circuit board technology. Owing to the fact that no metal has been precipitated on the resist surfaces in the currentless metallisation, in the electrolytic bath too no metal can be deposited on these sites. The metal structures are formed rapidly and have good metal-physics properties. Metals that can be deposited include copper, nickel, tin, lead, sold, silver, palladium and other metals as well as alloys of these metals. The card-shaded product obtained in this step is shown in FIG. 4.

5th step

In this step a decorative protective lacquer or varnish layer is applied in a conventional manner. The lacquers/varnishes and processes used for this purpose are identical to those used in printed circuit board technology. The finished, decoratively coated card is shown in FIG. 5.

The process according to the invention also comprises a step for applying a suitable catalyst for the currentless deposition of metals to the electrically nonconducting substrate. Ionic as well as colloidal catalyst systems are known for the application of the catalyst. Palladium is generally used as a catalytically active metal. Copper is of only limited suitability since it has a low catalytic activity. Solutions containing complex-ligand complexed palladium ions are for example used as ionic catalysts. The catalytic activity is then generated by reducing the palladium compound to palladium metal. The colloidal systems contain palladium in a zero oxidation state, and contain as protective colloid either an organic compound, for example polyvinyl alcohol, or tin(II) hydroxides. The last-mentioned catalysts are formed for example by combining palladium chloride and a tin(II) chloride in hydrochloric acid solution, followed by heating. In order to initiate the catalytic activity, the protective colloid must be removed. This process step is termed acceleration in the art.

According to an embodiment of the present invention, this step is carried out before the aforedescribed process step 1), i.e. after the pretreatment of the electrically non-conducting substrate. According to a further embodiment of the invention, the application of the catalyst is carried out before the aforedescribed process step 3), i.e. before the currentless deposition of the first thin metallic layer.

In this last variant the process according to the invention also comprises a step in which the photoresist and the catalyst adsorbed thereon is removed (strip-off step). In this step a suitable solution, as a rule an aqueous alkaline solution or a solution of organic solvents depending on the type of resist, is conveniently used, as is known from printed circuit board technology. In the case of thin layers this stripping step can be omitted.

In the variant of the process according to the invention in which the catalyst is applied (activation) before the process step 3), the step involving the removal of the photoresist is carried out immediately after the application of the catalyst suitable for the currentless deposition of metals, i.e. before the aforedescribed third step. Failing this, the photoresist can be removed after the deposition of the second metallic layer, i.e. after process step 4).

Of course—just as in printed circuit board technology further process steps may be carried out between the individual process steps, for example rinsing, cleaning, conditioning, acceleration, pickling and etching steps, as well as heating of the substrate.

The invention is illustrated in the examples.

EXAMPLE 1

Permanent resist

A 350 µm thick sheet-like ABS substrate was produced by welding together two ADS films of size 40 cm×60 cm. For the pretreatment, the resultant ABS substrate was roughened in a horizontally operating pumice flour brush machine by spraying and brushing with a pumice flour/water mixture, and was then dried. The thus pretreated ABS substrate was pickled for 5 minutes in a chromosulphuric acid pickling activation bath (360 g/l of sulphuric acid and 360 g/l of chromium(VI) oxide). After rinsing with water the structured and pickled ABS substrate was chromium-reduced for 1.5 minutes at room temperature with a sodium bisulphite solution (20 g/l). After renewed rinsing the substrate was immersed for 5 minutes in an aqueous solution containing 250 mg/l of palladium chloride, 340 g/l of tin(II) chloride and 250 g/l of sodium chloride (palladium colloid with tin(II) hydroxide as protective colloid). Catalytically active palladium clusters were thereby produced on the surface. Excess treatment solution was then removed from the surface by rinsing. An acceleration treatment was next carried out for 5 minutes at room temperature using a known acceleration (accelerator activator AK2 from Atotech). After drying, the negative, coarse conducting pattern, i.e. disregarding the ridges, was printed with a screen (200 mesh). A suitably adjusted, negatively operating liquid solder resist mask VAQS from Dupont was used as resist. Using a 100 µm wide striated mask, which covered the ridges, the surface was illuminated at 365 nm, developed in a conventional way with developer solution containing sodium carbonate, and rinsed several times in hot water. The solder resist material was cured by intense UV irradiation. The photostructuring process was repeated for the reverse side.

The now exposed catalysed substrate surface was then covered with a nickel-phosphorus alloy layer within 3 minutes at 45° C. by immersion in a currentless depositing nickel bath containing hypophosphite as reducing agent. The layer thickness of the currentless deposited nickel was 0.3 µm. The pH of the nickel bath was about 7. Excess nickel electrolyte was then rinsed off. Following this, a layer of a tin-lead alloy was electrolytically deposited within 12 minutes from a tin-lead electrolyte containing methanesulphonic acid. The thickness of the deposited layer was 8 µm.

A decorative protective lacquer layer of conventional composition was then applied.

EXAMPLE 2

The procedure described in Example 1 was adopted, except that the product ELPEMER© from Peters was used as solder resist material.

EXAMPLE 3

A 350 µm thick sheet-like ABS substrate was produced by welding together two ABS sheets of size 40 cm×60 cm. For the pretreatment the resultant ABS substrate was roughened in a horizontally operating pumice flour brushing machine by spraying and brushing with a pumice flour/water mixture. The substrate was then pickled for 5 minutes in a chromosulphuric acid pickling activation bath (360 g/l of sulphuric acid and 360 g/l of chromium(VI) oxide) and activated with palladium as described in Example 1. After rinsing with water at room temperature residues of chromium(VI) ions that were still adhering were reduced by immersion for 1.5 minutes in a 2 wt. % sodium bisulphite solution. After renewed rinsing with water the substrate was activated with palladium as described in Example 1. After drying, the negative, coarse conductive pattern was applied in a similar manner to that described in Example 1, the mesh width of the screen being 300 mesh however. A positively working photosensitive resist (according to German Patent Application P 195 46 140.1) was used.

After drying, the photosensitive resist was illuminated using a 100 µm wide slit mask (200 mJ/cm$^2$; wavelength 365 nm). After illumination, the thermal post-treatment necessary for this type of resist was carried out for 20 minutes at 80° C. followed by developing in a 1% sodium carbonate solution at 30° C. The process was then repeated for the reverse side of the film.

The now exposed catalysed substrate surface was then covered with a nickel-phosphorus alloy layer within 3 minutes at 45° C. by immersion in a currentless depositing nickel bath containing hypophosphite as reducing agent. The thickness of the currentless deposited nickel layer was 0.3 µm. The pH of the nickel bath was about 7. Excess nickel electrolyte was then rinsed off. A layer of a tin-lead alloy was next electrolytically deposited within 12 minutes at a current density of 2 Å/dm$^2$ from a tin-lead electrolyte containing methanesulphonic acid. The thickness of the deposited layer was 8 µm.

A decorative protective lacquer layer of conventional composition was then applied.

The resultant ABS platelet was then separated and cut up into individual card formats. When electronically tested the cards produced in the manner described above met the requirements of Brazilian phone cards.

EXAMPLE 4

A 350 μm thick sheet-like ABS substrate was produced by welding together two ABS films of size 40 cm×60 cm. For the pretreatment, the resultant ABS substrate was roughened in a horizontally operating pumice flour brushing machine by spraying and brushing with a pumice flour/water mixture, and the substrate was then dried. The substrate pretreated in this way was, as described in Example 3, selectively printed with a positively working liquid photosensitive resist and the ridges were photostructured. The photostructuring process was then repeated for the reverse side.

The ABS substrate structured as described above was pickled for 3 minutes at 50° C. in a chromosulphuric acid pickling bath containing 370 g/l of chromic acid and 370 g/l of sulphuric acid. After rinsing with water, the structured and pickled ABS substrate was chromium-reduced for 1.5 minutes at room temperature with a sodium bisulphite solution (20 g/l). After renewed rinsing the substrate was immersed for 5 minutes in an aqueous solution containing 250 mg/l of palladium chloride, 340 g/l of tin(II) chloride and 250 g/l of sodium chloride (palladium colloid with tin(II) hydroxide as protective colloid). Catalytically active palladium castors were thereby formed on the surface. Next, excess treatment solution was removed by rinsing the surface. An acceleration treatment was then carried out for 5 minutes at room temperature using a commercially available accelerator (accelerator activator AK2 from Atotech). After renewed rinsing, the structured and now accelerated ADS substrate was treated with an aqueous alkaline solution containing 100 g/l of potassium hydroxide, in order to remove the structured photoresist.

The substrate was next rinsed once more with water, and the now exposed catalysed substrate surface was then coated with a nickel-phosphorus alloy layer within 3 minutes at 45° C. by immersion in a currentless depositing nickel bath containing hypophosphite as reducing agent. The thickness of the currentless deposited nickel layer was 0.3 μm. The pH of the nickel bath was about 7. Excess nickel electrolyte was then rinsed off. A layer of a tin-lead alloy was next electrolytically deposited within 12 minutes at a current density of 2 Å/dm$^2$ from a tin-lead electrolyte containing methanesulphonic acid. The thickness of the deposited layer was 8 μm. A decorative protective lacquer layer of conventional composition was then applied.

What is claimed is:

1. A process for producing inductively operating counting systems by forming a conducting pattern on an electrically non-conducting substrate, wherein a suitable catalyst for the currentless deposition of metals is applied onto the electrically non-conducting substrate, said process comprising the steps of:

applying a liquid photoresist, said liquid photoresist being printed only onto the surface not subsequently covered by the conductive pattern and onto fine-structured portions of the conduction pattern;

photostructuring of the fine-structured portions of the conductive pattern by illumination and subsequent developing;

currentless deposition of a first thin metallic layer onto the exposed, catalytically coated surface regions;

electrolytic deposition of a second metallic layer onto the first metallic layer; and application of a decorative protective lacquer or varnish film;

wherein the suitable catalyst for the currentless deposition of metals is applied before the currentless deposition of the first thin metallic layer; and the photoresist and catalyst adsorbed thereon are subsequently removed, prior to the application of the decorative protective lacquer or varnish film.

2. The process according to claim 1, wherein the liquid photoresist is a positively operating silk screen printable photoresist.

3. The process according to claim 1 wherein the process is carried out without employing an etching step.

4. The process according to claim 1, wherein a step to remove the photoresist is carried out after the electrolytic deposition of the second metallic layer and prior to application of the decorative protective lacquer.

5. The process according to claim 1, wherein the inductively-operating counting system is a phone card.

* * * * *